United States Patent
Boeck et al.

(10) Patent No.: US 10,666,239 B2
(45) Date of Patent: May 26, 2020

(54) BALANCED FREQUENCY DOUBLER

(71) Applicant: Technische Universitaet Berlin, Berlin (DE)

(72) Inventors: Georg Boeck, Berlin (DE); Soenke Felix Vehring, Berlin (DE)

(73) Assignee: Technische Universitaet Berlin, Berlin (DE)

( * ) Notice: Subject to any disclaimer, the term of this patent is extended or adjusted under 35 U.S.C. 154(b) by 36 days.

(21) Appl. No.: 16/132,285

(22) Filed: Sep. 14, 2018

(65) Prior Publication Data

US 2020/0091900 A1    Mar. 19, 2020

(51) Int. Cl.
*H03K 5/00* (2006.01)
*H03K 17/56* (2006.01)

(52) U.S. Cl.
CPC ......... *H03K 5/00006* (2013.01); *H03K 17/56* (2013.01)

(58) Field of Classification Search
None
See application file for complete search history.

(56) References Cited

U.S. PATENT DOCUMENTS

| | | | | |
|---|---|---|---|---|
| 6,564,045 B1 * | 5/2003 | Fransis | ................ | H03D 7/1433 455/189.1 |
| 6,836,180 B1 * | 12/2004 | Kwok | ................... | H03H 11/22 327/552 |
| 8,917,805 B2 * | 12/2014 | Lee | .................... | H03K 5/00006 327/119 |
| 2012/0146690 A1 * | 6/2012 | Marshall | ............... | H03B 19/00 327/113 |
| 2014/0361815 A1 * | 12/2014 | Depaoli | ............ | H03K 5/00006 327/122 |

(Continued)

OTHER PUBLICATIONS

B. Razavi; "Design Considerations for Direct-Conversion Receivers"; IEEE Transactions on Circuits Systems II; Analog and Digital Signal Progressing; vol. 44; No. 6; pp. 428-435; Jun. 1997.

(Continued)

*Primary Examiner* — Cassandra F Cox
(74) *Attorney, Agent, or Firm* — Gordon Rees Scully Mansukhani LLP

(57) ABSTRACT

The invention inter alia relates to a balanced frequency doubler comprising a first frequency doubler unit providing a first input port and a second input port, a second frequency doubler unit providing a third input port and a fourth input port, wherein the first, second, third and fourth input port are configured to receive a first, second, third and fourth input signal, respectively, wherein the first, second, third and fourth input signals all have the same first harmonic frequency, but are phase-shifted relative to one another, wherein a first current, the frequency spectrum of which comprises a second harmonic frequency that is double the first harmonic frequency, is driven through the first frequency doubler unit in response to the first and second input signal, wherein a second current, the frequency spectrum of which also comprises the second harmonic frequency, is driven through the second frequency doubler unit in response to the third and fourth input signals, and wherein a balanced output signal of the frequency doubler is influenced by the first and second current.

17 Claims, 4 Drawing Sheets

(56) References Cited

U.S. PATENT DOCUMENTS

2017/0141763 A1* 5/2017 Moon .................... H03K 3/013
2017/0288607 A1* 10/2017 Alijabbari .............. H03B 19/18

OTHER PUBLICATIONS

M. Margraf et al.; "Analysis and Modeling of Low-Frequency Noise in Resistive FET Mixers"; IEEE Transactions on Microwave Theory Techniques: vol. 52; No. No. 7; pp. 1709-1718; Jul. 2004.

F. Ellinger et al.; "Ultracompact SOI CMOS Frequency Doubler for Low Power Applications at 26.5-28.5 GHz", IEEE Microwave and Wireless Components Letters; vol. 14; No. 2; pp. 53-55, Feb. 2004.

S. Wang et al.; "K-band CMOS frequency doubler with high fundamental rejection": Electronics Letters; vol. 50; No. 17; pp. 1211-1212; Aug. 14, 2014.

Kun-You Lin et al.; "A 14-23 GHz CMOS MMIC Distributed Doubler with a 22-dB Fundamental Rejection"; 2008 IEEE; Department of Electrical Engineering and Graduate Institute of Communication Engineering; National Taiwan University; Taipei, Taiwan 106; R.O.C.; pp. 1477-1480.

M. Ferndahl et al.; "40 and 60 GHz Frequency Doublers in 90-nm CMOS"; 2004 IEEE; Microwave Electronic Laboratory; Chalmers University of Technology; 2004 IEEE MTT-S Digest: vol. 1; pp. 179-182.

S. Yuan et al.; "Compact V band frequency doubler with true balanced differential output", 2013 IEEE Bipolar/BiCMOS Circuits and Technology Meeting (BCTM), Sep. 2013; pp. 191-194.

J. Wan et al.; "A Truly Balanced Q-Band CMOS Frequency Doubler Based on Hybrid Quadrature Coupler"; IEEE Microwave and Wireless Components Letters; vol. 27; No. 2; Feb. 2017; pp. 165-167.

S. Saberi et al.; "A Wideband Millimeter-Wave Frequency Doubler-Tripler in 0.13 um CMOS"; 2010 IEEE Radio Frequency Integrated Circuits Symposium; May 2010; pp. 65-68.

Ping-Han Tsai et al.; "Broadband Balanced Frequency Doublers With Fundamental Rejection Enhancement Using a Novel Compensated Marchand Balun": IEEE Transactions on Microwave Theory and Techniques; vol. 61; No. 5; pp. 1913-1923; May 2013.

Kun-You Lin et al.; "A K-Band CMOS Distributed Doubler With Current-Reuse Technique"; IEEE Microwave and Wireless Components Letters; vol. 19; No. 5; pp. 308-310; May 2009.

Yu Ye et al.; "A High Efficiency E-Band CMOS Frequency Doubler With a Compensated Transformer-Based Balun for Matching Enhancement", IEEE Microwave and Wireless Components Letters; vol. 26; No. 1; pp. 40-42; Jan. 2016.

Hsin-Chang Lin et al.; "A 135-160 GHz Balanced Frequency Doubler in 45 nm CMOS with 3.5 dBm Peak Power"; 2014 IEEE MTT-S Int. Microwave Symp. (IMS2014), Jun. 2014; pp. 1-4.

Robert B. Staszewski et al.; "All-digital PLL and Transmitter for Mobile Phones"; IEEE Journal of Solid-State Circuits; vol. 40; No. 12; Dec. 2005; pp. 2469-2482.

Wanghua Wu et al.; "A 56.4-to-63.4 GHz Multi-Rate All-Digital Fractional-N PLL for FMCW Radar Applications in 65 nm CMOS"; IEEE Journal of Solid-State Circuits; vol. 49; No. 5; pp. 1081-1096; May 2014.

D. Maurath et al.; "A Low-Phase Noise 12 GHz Digitally Controlled Oscillator in 65 nm CMOS for a FMCW Radar Frequency Synthesizer"; Proceedings of the 2017 12th European Microwave Integrated Circuits Conference (EuMIC); Nuremberg, Germany; Oct. 9-10, 2017; pp. 232-235.

\* cited by examiner

BALANCED FREQUENCY DOUBLER

The invention relates to balanced frequency doublers and methods for generating a balanced output signal.

BACKGROUND OF THE INVENTION

The aggressive cost reduction of radar and communication solutions can only be realistically achieved by the highest level of integration. For highest integration density, the use of a digitally controlled oscillator in an all digital phased-locked loop is favored since it circumvents analog tuning voltages and filters. At microwave frequencies fundamental local oscillator signal generation becomes a challenge as with increasing frequency the limited Q-factor of the digitally controlled oscillator LC-tank impairs the phase noise. Therefore, local oscillator signal generation by combination of all digital phased-locked loop with frequency multiplier is an attractive choice regarding overall phase noise and integration density. For proper operation of down-conversion receivers, the frequency multiplier should deliver sufficient output power to saturate the mixer at his local oscillator port. An unbalanced or pseudo balanced local oscillator signal generation with output power of around 0 dBm increases the risk of local oscillator leakage [1] compared to balanced local oscillator signal generation which can cause a serious 1/f noise impairment [2] in direct conversion receivers. Following this consideration, a balanced frequency multiplier with output power higher than 0 dBm is favored for implementation. One frequency doubler concept is a common-source circuit with matched second harmonic at the output [3]-[6]. However, these doublers are unbalanced and show only fair fundamental rejection and output power lower than 0 dBm with low efficiency. Another way of frequency doubling is the usage of a Gilbert cell fed by two signals of equal frequency at the local oscillator and radio frequency port. This approach suffers from a DC offset at the output and an imbalance due to local oscillator feedthrough. As demonstrated in [7], it is not possible to achieve truly balanced signaling meaning amplitude and phase balance simultaneously in a single Gilbert cell. In [8] the unwanted imbalance due to local oscillator feedthrough is compensated by a second Gilbert cell which is excited with a phase difference of 90°. Furthermore, in a Gilbert cell, more active devices have to be excited by the input signal which lowers the efficiency. Doublers which appear most in literature are push-push doublers. Push-push doublers have been successfully demonstrated at various frequencies, technologies, and with high output power [9]-[13]. A push-push doubler is inherently balanced at the input and unbalanced at the output. If a balanced input and output is intended, one needs a transformer balun at the output forming a balanced output out of the unbalanced node. In this sense, the doubler is pseudo balanced since it incorporates an unbalanced node. The transformer balun introduces undesired losses. In order to overcome losses introduced by a transformer balun and to avoid local oscillator leakage in receivers, a truly balanced doubler is desired.

Balanced frequency doublers that are truly balanced cannot be found in the literature. The term "truly balanced frequency doubler" hereinafter refers to doublers without any unbalanced node within the circuit except nodes for DC supply and biasing.

OBJECTIVE OF THE PRESENT INVENTION

An objective of the present invention is to provide a truly balanced frequency doubler.

A further objective of the present invention is to provide a method of generating a balanced output signal based on frequency-doubling.

BRIEF SUMMARY OF THE INVENTION

An embodiment of the present invention relates to a balanced frequency doubler comprising
- a first frequency doubler unit providing a first input port and a second input port,
- a second frequency doubler unit providing a third input port and a fourth input port,
- wherein the first, second, third and fourth input port are configured to receive a first, second, third and fourth input signal, respectively,
- wherein the first, second, third and fourth input signals all have the same first harmonic frequency, but are phase-shifted relative to one another,
- wherein a first current, the frequency spectrum of which comprises a second harmonic frequency that is double the first harmonic frequency, is driven through the first frequency doubler unit in response to the first and second input signal,
- wherein a second current, the frequency spectrum of which also comprises the second harmonic frequency, is driven through the second frequency doubler unit in response to the third and fourth input signals, and
- wherein a balanced output signal of the frequency doubler is influenced by the first and second current.

The first frequency doubler unit is preferably a push-push frequency doubler unit.

The second frequency doubler unit is preferably a push-push frequency doubler unit.

The output signal of the frequency doubler is preferably formed by or is at least proportional to the difference between a first voltage drop caused by the first current at a first electrical load, and a second voltage drop caused by the second current at a second electrical load.

The first and second doubler units are preferably electrically arranged in parallel and preferably have two common connection points.

Each of the first and second frequency doubler units preferably has an electrical midpoint, the electrical potential of which lies between the electrical potentials of the two common connection points.

The output signal of the frequency doubler is preferably formed by the voltage between the electrical midpoints.

The first frequency doubler unit preferably comprises a first electrical load and a first switch module.

The first switch module is preferably arranged in series with the first electrical load.

The first switch module preferably comprises a first transistor and a second transistor arranged in parallel. In case of field effect transistors, the first transistor and the second transistor are preferably arranged with drain-to-source in parallel. In case of bipolar transistors, the first transistor and the second transistor are preferably arranged with collector-to-emitter in parallel.

The second frequency doubler unit preferably comprises a second electrical load and a second switch module.

The second switch module is preferably arranged in series with the second electrical load and comprises a third transistor and a fourth transistor arranged in parallel. In case of field effect transistors, the third and the fourth transistor are preferably arranged with drain-to-source in parallel. In case of bipolar transistors, the third transistor and the fourth transistor are preferably arranged with collector-to-emitter in parallel.

A transistor in common-gate configuration is preferably arranged in series with the first electrical load and the first switch module.

A further transistor in common-gate configuration is preferably arranged in series with the second electrical load and the second switch module.

The first input signal is preferably fed into the first transistor, the second input signal into the second transistor, the third input signal into the third transistor and the fourth input signal into the fourth transistor wherein, in response to the first and second input signal, the first current is driven through the first load, and wherein, in response to the third and fourth input signal, the second current is driven through the second load.

The voltage between a first midpoint that electrically lies between the first electrical load and the first switch module, and a second midpoint that electrically lies between the second electrical load and the second switch module, preferably forms the output signal of the frequency doubler.

Each of the first and second loads may be an inductive load.

A coil having two outer terminals and a middle terminal may form a first load in the first frequency doubler unit and a second load in the second frequency doubler unit.

The voltage between the coil's outer terminals preferably forms the output signal of the frequency doubler.

The first and second frequency doubler units are preferably electrically arranged in parallel and have two common connection points, wherein the coil's middle terminal is one of the two common connection points.

One of the coil's outer terminals of the coil preferably forms the midpoint in the first frequency doubler unit, and the other of the coil's outer terminals preferably forms the midpoint in the second frequency doubler unit.

The input signals preferably all have an offset voltage.

The input signals are preferably sinusoidal signals.

The sinusoidal portion of all four input signals has preferably the same amplitude and all input signals preferably have the same offset voltage.

The offset voltage preferably equals the threshold voltage of the transistors.

The balanced frequency doubler preferably comprises a quadrature voltage-controlled oscillator that generates the first, second, third and fourth input signal. The quadrature voltage-controlled oscillator is preferably a digitally controlled oscillator (e.g. based on an 8 bit control signal).

The first and second input signals are preferably in-phase signals and the third and fourth input signals are preferably quadrature signals.

The phase difference between the first and second input signal is preferably 180° or at least in a range between 162° and 198°.

The phase difference between the third and fourth input signal is preferably 180° or at least in a range between 162° and 198°.

The phase difference between the first and third input signal is preferably 90° or at least in a range between 81° and 99°.

A further embodiment of the invention relates to a method for generating a balanced output signal comprising the steps of feeding a first and a second input signal into a first frequency doubler unit, feeding a third and a fourth input signal into a second frequency doubler unit, wherein the first, second, third and fourth input signals all have the same first harmonic frequency, but are phase-shifted relative to one another, wherein a first current is driven through the first frequency doubler unit in response to the first and second input signal, wherein the frequency spectrum of the first current comprises a second harmonic frequency that is twice the first harmonic frequency, wherein a second current is driven through the second frequency doubler unit in response to the third and fourth input signal, wherein the frequency spectrum of the second current also comprises the second harmonic frequency, and wherein the balanced output signal of the frequency doubler is influenced by the first and second current.

A further embodiment of the present invention relates to a balanced frequency doubler comprising a first doubler unit having a first electrical load and a first switch module that is arranged in series with the first electrical load and comprises a first transistor and a second transistor arranged in parallel, a second doubler unit having a second electrical load and a second switch module that is arranged in series with the second electrical load and comprises a third transistor and a fourth transistor arranged in parallel, wherein the first, second, third and fourth input port are configured to receive a first, second, third and fourth input signal, respectively, wherein the first, second, third and fourth input signals have the same first harmonic frequency, wherein the phase difference between the first and second input signal is 1800 or at least in a range between 162° and 198°, wherein the phase difference between the third and fourth input signal is 180° or at least in a range between 162° and 198°, wherein the phase difference between the first and third input signal is 90° or at least in a range between 81° and 99°, wherein a first current, the frequency spectrum of which comprises a second harmonic frequency that is twice the first harmonic frequency, is driven through the first doubler unit in response to the first and second input signal, wherein a second current, the frequency spectrum of which also comprises the second harmonic frequency, is driven through the second doubler unit in response to the third and fourth input signal, and wherein a balanced output signal of the frequency doubler is influenced by the first and second current.

The first and second doubler unit are preferably electrically arranged in parallel and have two common connection points.

Each of the first and second doubler units preferably has an electrical midpoint, the electrical potential of which lies between the electrical potentials of the two common connection points.

The output signal of the frequency doubler is preferably the voltage between the electrical midpoints.

BRIEF DESCRIPTION OF THE DRAWINGS

In order that the manner in which the above-recited and other advantages of the invention are obtained will be readily understood, a more particular description of the invention briefly described above will be rendered by reference to specific embodiments thereof which are illustrated in the appended drawings. Understanding that these drawings depict only typical embodiments of the invention and are therefore not to be considered to be limiting of its scope, the invention will be described and explained with additional specificity and detail by the use of the accompanying drawings in which.

DETAILED DESCRIPTION OF THE PREFERRED EMBODIMENTS

The preferred embodiments of the present invention will be best understood by reference to the drawings. It will be readily understood that the present invention, as generally described and illustrated in the figures herein, could vary in a wide range. Thus, the following more detailed description of the exemplary embodiments of the present invention, as represented in the figures, is not intended to limit the scope of the invention, as claimed, but is merely representative of presently preferred embodiments of the invention.

Figure 1:
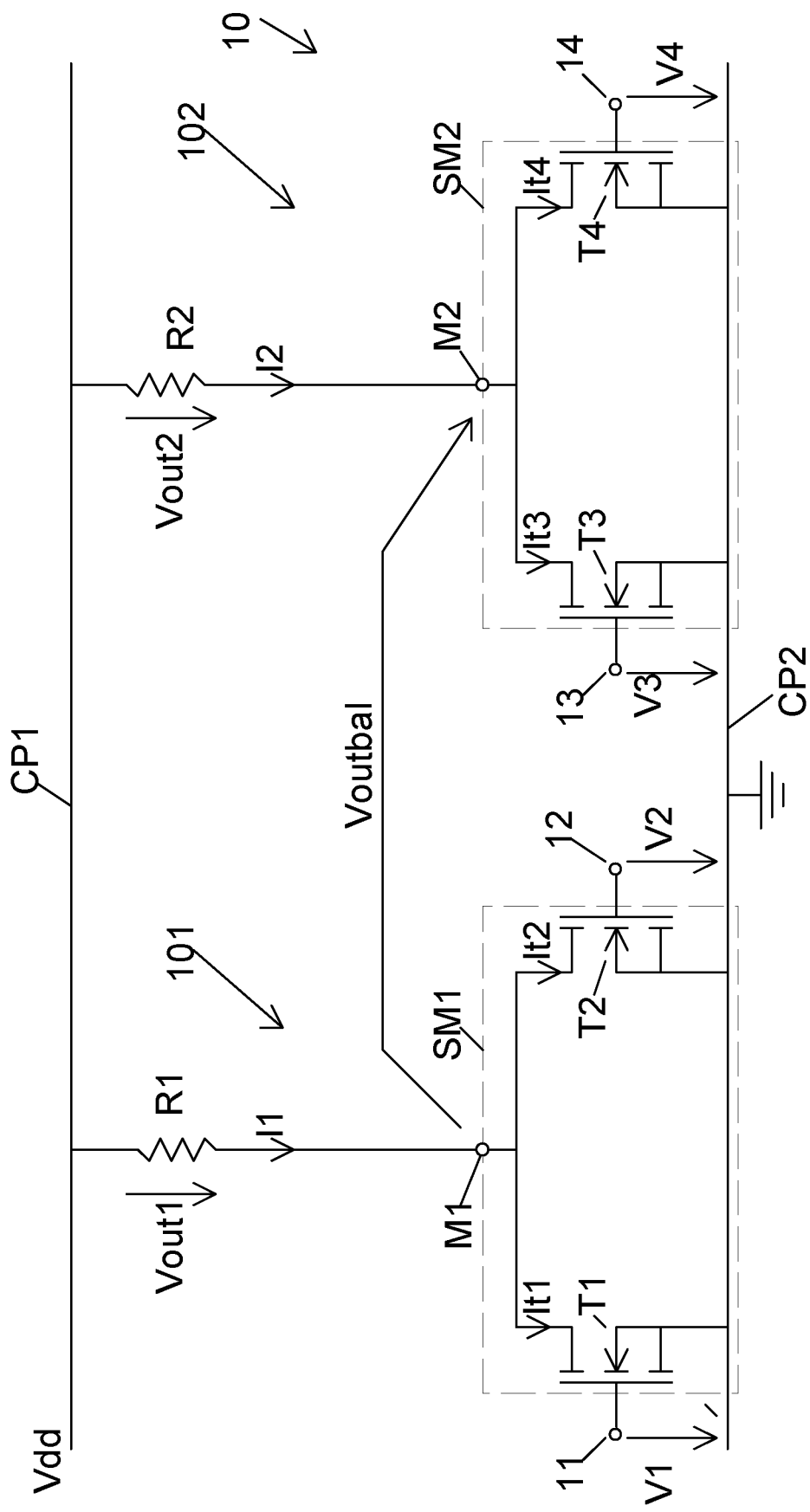
FIG. 1 illustrates a first exemplary embodiment of a balanced frequency doubler.

FIG. 1 shows a first exemplary embodiment of a balanced frequency doubler 10 according to the present invention. The balanced frequency doubler 10 comprises a first frequency doubler unit 101 that provides a first input port 11 and a second input port 12. The balanced frequency doubler 10 further comprises a second frequency doubler unit 102 providing a third input port 13 and a fourth input port 14.

The first frequency doubler unit 101 and the second frequency doubler unit 102 are preferably push-push frequency doubler units.

The first and second doubler unit 101, 102 are electrically arranged in parallel and have two common connection points CP1 and CP2. The connection point CP1 may be connected with a supply voltage Vdd. The other connection point CP2 may have ground potential.

The first frequency doubler unit 101 comprises a first electrical load R1 and a first switch module SM1 that is arranged in series with the first electrical load R1 and comprises a first transistor T1 and a second transistor T2. In case of field effect transistors, the first transistor T1 and the second transistor T2 are preferably arranged with drain-to-source in parallel. In case of bipolar transistors, the first transistor T1 and the second transistor T2 are preferably arranged with collector-to-emitter in parallel.

A first electrical midpoint M1 lies between the first switch module SM1 and the first load R1.

The second frequency doubler unit 102 comprises a second electrical load R2 and a second switch module SM2 that is arranged in series with the second electrical load R2 and comprises a third transistor T3 and a fourth transistor T4. In case of field effect transistors, the third transistor T3 and the fourth transistor T4 are preferably arranged with drain-to-source in parallel. In case of bipolar transistors, the third transistor T3 and the fourth transistor T4 are preferably arranged with collector-to-emitter in parallel.

A second electrical midpoint M2 lies between the second switch module SM2 and the second load R2.

The first, second, third and fourth input ports 11-14 are configured to receive a first, second, third and fourth input signal V1, V2, V3 and V4, respectively.

In the exemplary embodiment of FIG. 1, the input signals V1-V4 all have the same first harmonic frequency f, but are phase-shifted relative to one another. In an exemplary fashion, it is assumed hereinafter that the input signals V1-V4 read as follows:

$$V1(t) = V0 \sin(2\pi ft) + Vth$$

$$V2(t) = -V0 * \sin(2\pi ft) + Vth$$

$$V3(t) = V0 \cos(2\pi ft) + Vth$$

$$V4(t) = -V0 * \cos(2\pi ft) + Vth$$

where V0 describes the amplitude of the input signals V1-V4, Vth the threshold voltage of the transistors T1-T4, f the first harmonic frequency and t the time.

Each of the transistors T1-T4 may have the following current-versus-voltage characteristic:

$$It(t) = K(V(t) - Vth)^2 \text{ for } V(t) > Vth, \text{ otherwise } It(t) = 0$$

where It(t) describes the current through the transistor, V(t) the gate voltage, K a constant and Vth the threshold voltage of the transistor.

In this case, the current It1 through the first transistor T1, the current It2 through the second transistor T2, the current It3 through the third transistor T3, and the current It4 through the fourth transistor T4 read as follows:

$$It1(t) = K(V0 \sin(2\pi ft))^2 \text{ for } V1(t) > Vth, \text{ otherwise } It1(t) = 0$$

$$It2(t) = -K(V0 \sin(2\pi ft))^2 \text{ for } V2(t) > Vth, \text{ otherwise } It2(t) = 0$$

$$It3(t) = K(V0 \cos(2\pi ft))^2 \text{ for } V3(t) > Vth, \text{ otherwise } It3(t) = 0$$

$$It4(t) = -K(V0 \cos(2\pi ft))^2 \text{ for } V4(t) > Vth, \text{ otherwise } It4(t) = 0$$

In response to the first input signal V1 and the second input signal V2, a first current I1 is driven through the first load R1. Due to the phase shift between the transistor currents It1 and It2, the frequency spectrum of the first current I1 comprises a second harmonic frequency. The second harmonic frequency 2*f is twice the first harmonic frequency f of the input signals V1 and V2. The first current I1 causes a first voltage drop Vout1 at the first electrical load R1.

In response to the third signal V3 and the fourth signal input V4 a second current I2 is driven through the second load R2. The frequency spectrum of the second current I2 also comprises the second harmonic frequency 2*f. The second current I2 causes a second voltage drop Vout2 at the second electrical load R2.

A balanced output signal Voutbal of the balanced frequency doubler 10 is formed between the two midpoints M1 and M2, i.e. by the difference voltage between the first voltage drop Vout1 and the second voltage drop Vout2 according to:

$$Voutbal = Vout1 - Vout2 \text{ and}$$

$$Voutbal(t) = R * K * V0^2 \cos(4\pi ft)$$

It is apparent that the output signal Voutba1 is balanced because it starts and ends on an electrical midpoint and not on a common point.

Figure 2:
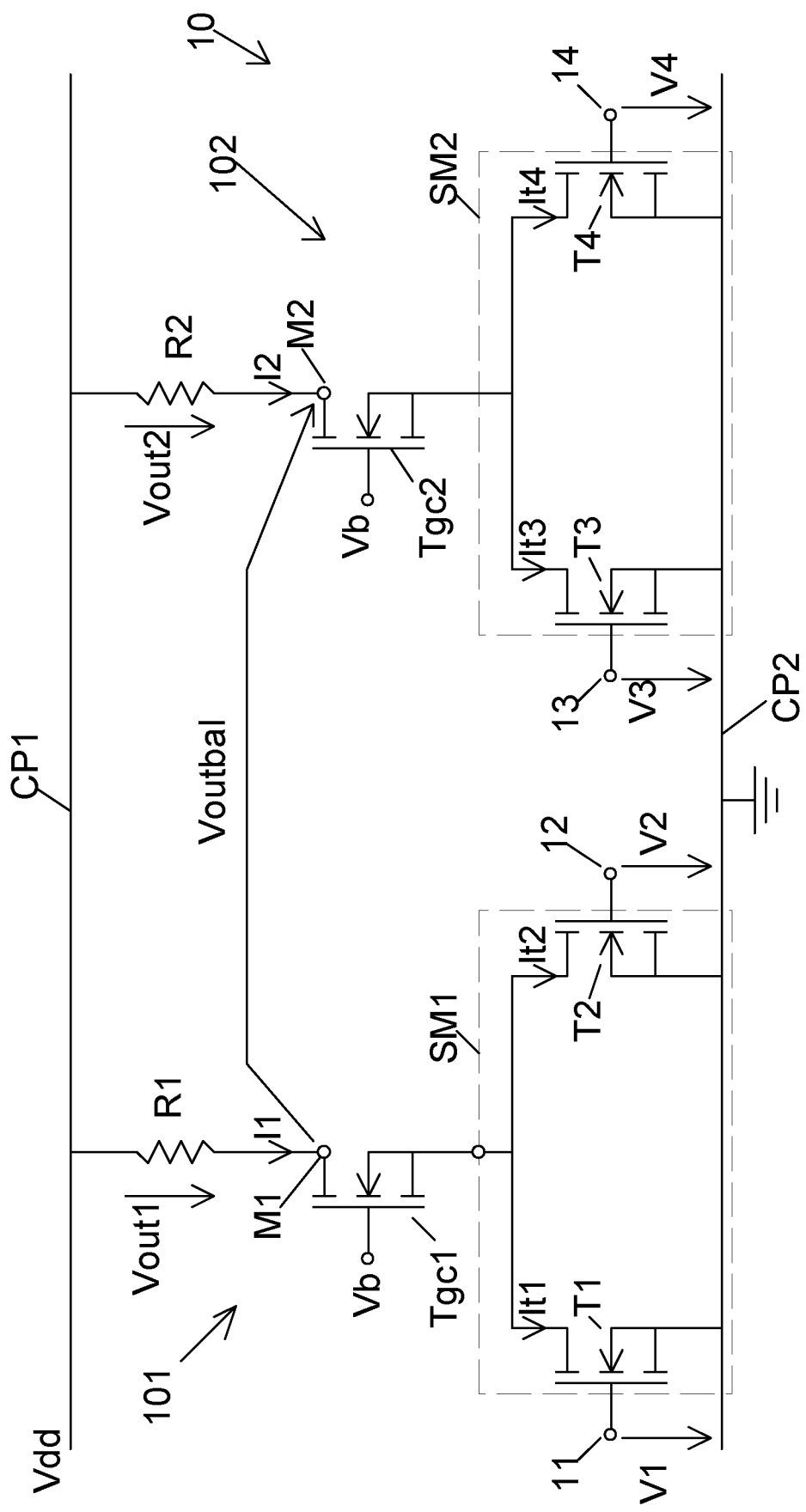
FIG. 2 illustrates a second exemplary embodiment of a balanced frequency doubler, which comprises transistors in common-gate configuration.

FIG. 2 shows a second exemplary embodiment of a balanced frequency doubler 10 according to the present invention. The balanced frequency doubler 10 resembles the embodiment of FIG. 1, but in addition comprises a transistor Tgc1 in common-gate configuration arranged in series with the first electrical load R1 and the first switch module SM1, as well as a further transistor Tgc2 in common-gate configuration arranged in series with the second electrical load R2 and the second switch module SM2. The gates of the transistors Tgc1 and Tgc2 are provided with a constant bias voltage Vb.

The transistors Tgc1 and Tgc2 lead to a larger output signal Voutba1 by amplifying the first current I1 and the second current I2.

Figure 3:
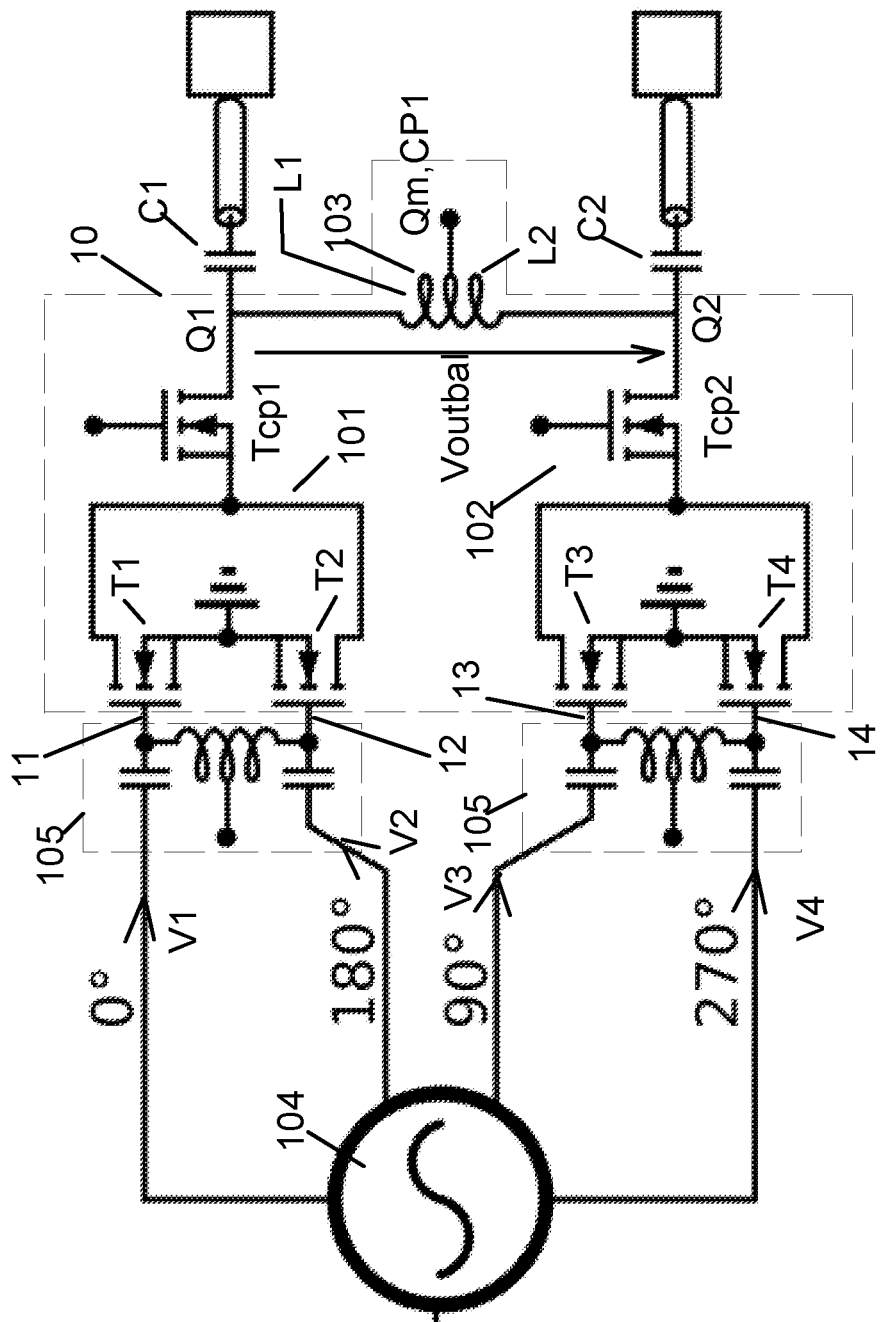
FIG. 3 illustrates a third embodiment of a balanced frequency doubler in connection with a quadrature voltage-controlled oscillator.

FIG. 3 shows a third exemplary embodiment of a balanced frequency doubler 10. The balanced frequency doubler 10 comprises a coil 103 having a first and second outer terminal Q1, Q2 and a middle terminal Qm. The middle terminal Qm forms a connection point CP1 and is connected with the supply voltage Vdd.

The impedance between the first terminal Q1 and the middle terminal Qm forms a first load L1 in the first frequency doubler unit 101. The impedance between the second terminal Q2 and the middle terminal Qm forms a second load L2 in the second frequency doubler unit 102.

The output signal Voutba1 of the frequency doubler 10 is generated between the coil's outer terminals Q1 and Q2.

In the embodiment of FIG. 3, the voltage between the coil's outer terminals Q1 and Q2, i.e. the output signal Voutba1, may be accessed through capacitors C1 and C2.

FIG. 3 also shows a quadrature voltage-controlled oscillator 104 that generates the first, second, third and fourth input signal V1, V2, V3, V4. In FIG. 3, the phase between the input signals V2-V4 and V1 is 90°, 180° and 270°. The input signals V1, V2, V3, V4 may be connected to the balanced frequency doubler 10 via bias tees 105.

In FIG. 3, the voltage-controlled oscillator 104 and the bias tees 105 are external components. Alternatively, the voltage-controlled oscillator 104 and/or the bias tees 105 may be internal components of the balanced frequency doubler 10.

The quadrature voltage-controlled oscillator is preferably a digitally controlled oscillator (e.g. based on an 8 bit control signal).

Figure 4:
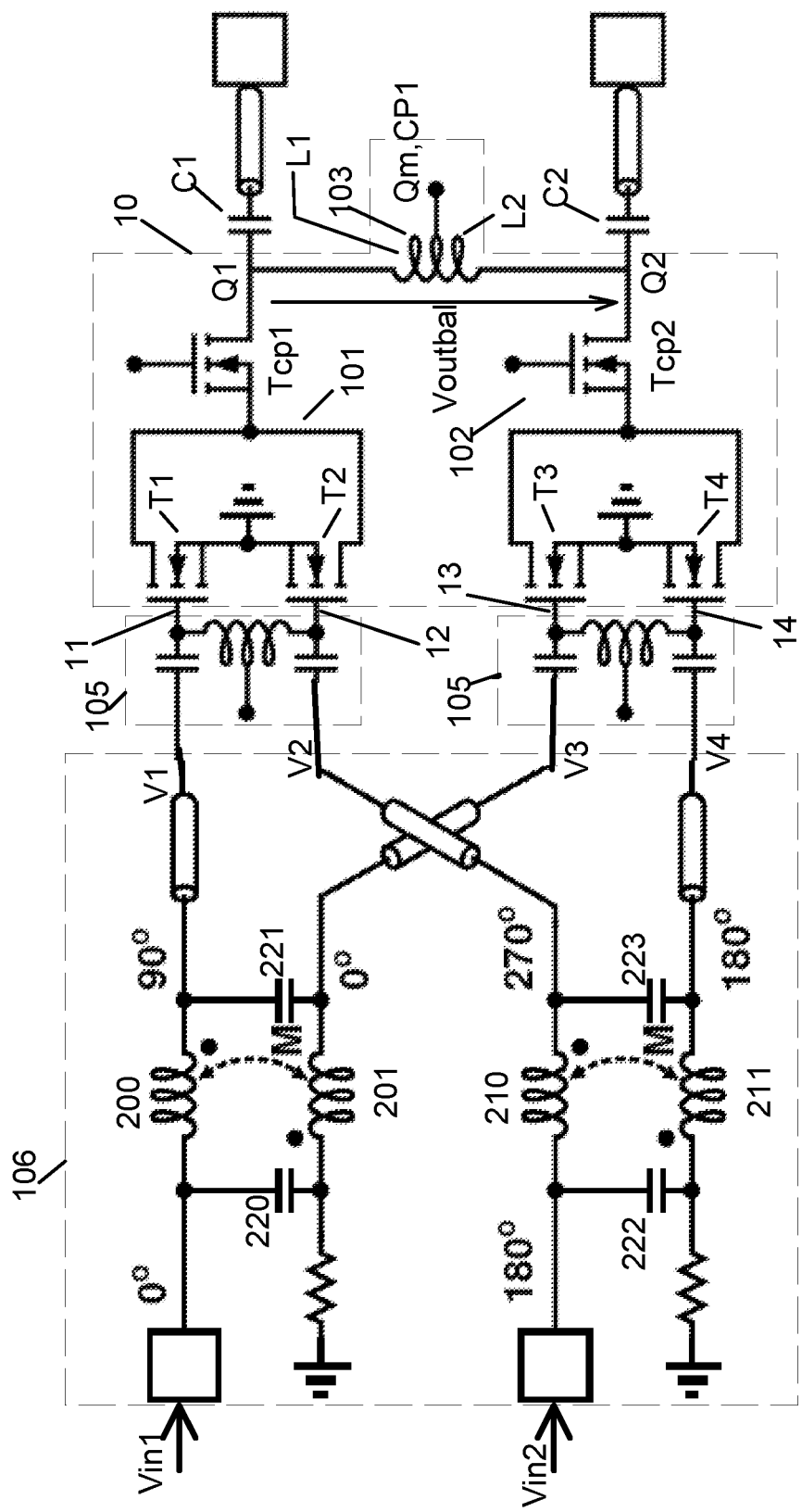
FIG. 4 illustrates the third embodiment of a balanced frequency doubler in connection with a phase shifter and power divider unit.

FIG. 4 shows the third exemplary embodiment of a balanced frequency doubler 10 according to FIG. 3 in connection with a phase shifter unit 106. The phase shifter unit 106 generates the first, second, third and fourth input signal V1, V2, V3, V4 based on two signals Vin1 and Vin2 that are phase-shifted by 180° relative to each other. To this end, the phase shifter unit 106 may comprise a first pair of coupled coils 200 and 201, a second pair of coupled coils 210 and 211, and capacitors 220, 221, 222 and 223 which may be connected with one another as shown in FIG. 4.

The input signals V1, V2, V3, V4 of the phase shifter unit 106 may be inputted into the balanced frequency doubler 10 via bias tees 105.

In FIG. 4, the phase shifter unit 106 and the bias tees 105 are external components. Alternatively, the shifter unit 106 and/or the bias tees 105 may be internal components of the balanced frequency doubler 10.

The various embodiments and aspects of embodiments of the invention disclosed herein are to be understood not only in the order and context specifically described in this specification, but to include any order and any combination thereof. Whenever the context requires, all words used in the singular number shall be deemed to include the plural and vice versa. Whenever the context requires, all options that are listed with the word "and" shall be deemed to include the world "or" and vice versa, and any combination thereof.

In the drawings and specification, there have been disclosed a plurality of embodiments of the present invention. The applicant would like to emphasize that each feature of each embodiment may be combined with or added to any other of the embodiments in order to modify the respective embodiment and create additional embodiments. These additional embodiments form a part of the present disclosure and, therefore, the applicant may file further patent claims regarding these additional embodiments at a later stage of the prosecution.

Further, the applicant would like to emphasize that each feature of each of the following dependent claims may be combined with any of the present independent claims as well as with any other (one or more) of the present dependent claims (regardless of the present claim structure). Therefore, the applicant may direct further patent claims towards other claim combinations at a later stage of the prosecution.

REFERENCES

[1] B. Razavi, "Design considerations for direct-conversion receivers," IEEE Trans. Circuits Syst. II, vol. 44, no. 6, pp. 428-435, June 1997.

[2] M. Margraf and G. Boeck, "Analysis and modeling of low-frequency noise in resistive FET mixers," IEEE Trans. Microw. Theory Tech., vol. 52, no. 7, pp. 1709-1718, July 2004.

[3] F. Ellinger and H. Jackel, "Ultracompact SOI CMOS Frequency Doubler for Low Power Applications at 26.5-28.5 GHz," IEEE Microw. Wireless Compon. Lett., vol. 14, no. 2, pp. 53-55, February 2004.

[4] S. Wang and C. T. Chang, "K-band CMOS frequency doubler with high fundamental rejection," Electron. Lett., vol. 50, no. 17, pp. 1211-1212, August 2014.

[5] K.-Y. Lin et al., "A 14-23 GHz CMOS MMIC Distributed Doubler with a 22-dB Fundamental Rejection," in 2008 IEEE MTT-S Int. Microwave Symp. Dig., June 2008, pp. 1477-1480.

[6] M. Ferndahl et al., "40 and 60 GHz Frequency Doublers in 90-nm CMOS," in 2004 IEEE MTT-S Int. Microwave Symp. Digest (IEEE Cat. No. 04CH37535), vol. 1, June 2004, pp. 179-182 Vol. 1.

[7] S. Yuan and H. Schumacher, "Compact V band frequency doubler with true balanced differential output," in 2013 IEEE Bipolar/BiCMOS Circuits and Technology Meeting (BCTM), September 2013, pp. 191-194.

[8] J. Wan et al., "A Truly Balanced Q-Band CMOS Frequency Doubler Based on Hybrid Quadrature Coupler," IEEE Microw. Wireless Compon. Lett., vol. 27, no. 2, pp. 165-167, February 2017.

[9] S. S. Ghouchani and J. Paramesh, "A Wideband Millimeter-Wave Frequency Doubler-Tripler in 0.13 um CMOS," in 2010 IEEE Radio Frequency Integrated Circuits Symp., May 2010, pp. 65-68.

[10] P. H. Tsai et al., "Broadband Balanced Frequency Doublers With Fundamental Rejection Enhancement Using a Novel Compensated Marchand Balun," IEEE Trans. Microw. Theory Tech., vol. 61, no. 5, pp. 1913-1923, May 2013.

[11] K. Y. Lin et al., "A K-Band CMOS Distributed Doubler With Current-Reuse Technique," IEEE Microw. Wireless Compon. Lett., vol. 19, no. 5, pp. 308-310, May 2009.

[12] Y. Ye et al., "A High Efficiency E-Band CMOS Frequency Doubler With a Compensated Transformer-Based Balun for Matching Enhancement," IEEE Microw. Wireless Compon. Lett., vol. 26, no. 1, pp. 40-42, January 2016.

[13] H. C. Lin and G. M. Rebeiz, "A 135-160 GHz Balanced Frequency Doubler in 45 nm CMOS with 3.5 dBm Peak Power," in 2014 IEEE MTT-S Int. Microwave Symp. (IMS2014), June 2014, pp. 1-4.

The invention claimed is:

1. Balanced frequency doubler comprising
a first frequency doubler unit providing a first input port and a second input port,
a second frequency doubler unit providing a third input port and a fourth input port,
wherein the first, second, third and fourth input ports are configured to receive a first, second, third and fourth input signal, respectively,
wherein the first, second, third and fourth input signals all have the same first harmonic frequency, but are phase-shifted relative to one another,
wherein a first current, the frequency spectrum of which comprises a second harmonic frequency that is double the first harmonic frequency, is driven through the first frequency doubler unit in response to the first and second input signal,
wherein a second current, the frequency spectrum of which also comprises the second harmonic frequency, is driven through the second frequency doubler unit in response to the third and fourth input signals, and
wherein a balanced output signal of the frequency doubler is influenced by the first and second current; and
wherein the output signal of the frequency doubler is formed by or is at least proportional to the difference between a first voltage drop caused by the first current at a first electrical load, and a second voltage drop caused by the second current at a second electrical load.

2. Balanced frequency doubler of claim 1, wherein each of the first and second loads is an inductive load.

3. Balanced frequency doubler comprising:
a first frequency doubler unit providing a first input port and a second input port,
a second frequency doubler unit providing a third input port and a fourth input port,
wherein the first, second, third and fourth input ports are configured to receive a first, second, third and fourth input signal, respectively,
wherein the first, second, third and fourth input signals all have the same first harmonic frequency, but are phase-shifted relative to one another,
wherein a first current, the frequency spectrum of which comprises a second harmonic frequency that is double the first harmonic frequency, is driven through the first frequency doubler unit in response to the first and second input signal,
wherein a second current, the frequency spectrum of which also comprises the second harmonic frequency, is driven through the second frequency doubler unit in response to the third and fourth input signals,
wherein a balanced output signal of the frequency doubler is influenced by the first and second current, and
wherein the first and second doubler units are electrically arranged in parallel and have two common connection points.

4. Balanced frequency doubler of claim 3,
wherein each of the first and second frequency doubler units has an electrical midpoint, the electrical potential of which lies between the electrical potentials of the two common connection points, and
wherein the output signal of the frequency doubler is formed by the voltage between the electrical midpoints.

5. Balanced frequency doubler of claim 4,
wherein one of the coil's outer terminals of a coil forms the midpoint in the first frequency doubler unit, and
wherein the other of the coil's outer terminals forms the midpoint in the second frequency doubler unit.

6. Balanced frequency doubler comprising:
a first frequency doubler unit providing a first input port and a second input port,
a second frequency doubler unit providing a third input port and a fourth input port,
wherein the first, second, third and fourth input ports are configured to receive a first, second, third and fourth input signal, respectively,
wherein the first, second, third and fourth input signals all have the same first harmonic frequency, but are phase-shifted relative to one another,
wherein a first current, the frequency spectrum of which comprises a second harmonic frequency that is double the first harmonic frequency, is driven through the first frequency doubler unit in response to the first and second input signal,
wherein a second current, the frequency spectrum of which also comprises the second harmonic frequency, is driven through the second frequency doubler unit in response to the third and fourth input signals,
wherein a balanced output signal of the frequency doubler is influenced by the first and second current, and
wherein the first frequency doubler unit comprises a first electrical load and a first switch module that is arranged in series with the first electrical load and comprises a first transistor and a second transistor arranged with drain-to-source in parallel, and
wherein the second frequency doubler unit comprises a second electrical load and a second switch module that is arranged in series with the second electrical load and comprises a third transistor and a fourth transistor arranged with drain-to-source in parallel.

7. Balanced frequency doubler of claim 6,
wherein a transistor in common-gate configuration is arranged in series with the first electrical load and the first switch module, and
wherein a further transistor in common-gate configuration is arranged in series with the second electrical load and the second switch module.

8. Balanced frequency doubler of claim 6,
wherein the first input signal is fed into the first transistor, the second input signal into the second transistor, the third input signal into the third transistor and the fourth input signal into the fourth transistor,
wherein, in response to the first and second input signal, the first current is driven through the first load, and
wherein, in response to the third and fourth input signal, the second current is driven through the second load.

9. Balanced frequency doubler of claim 8, wherein the voltage between a first midpoint that electrically lies between the first electrical load and the first switch module, and a second midpoint point that electrically lies between the second electrical load and the second switch module, forms the output signal of the frequency doubler.

10. Balanced frequency doubler of claim 6, wherein each input signal has the same offset voltage, and wherein the offset voltage equals the threshold voltage of the transistors.

11. Balanced frequency doubler comprising:
a first frequency doubler unit providing a first input port and a second input port,
a second frequency doubler unit providing a third input port and a fourth input port,
wherein the first, second, third and fourth input ports are configured to receive a first, second, third and fourth input signal, respectively,
wherein the first, second, third and fourth input signals all have the same first harmonic frequency, but are phase-shifted relative to one another,
wherein a first current, the frequency spectrum of which comprises a second harmonic frequency that is double the first harmonic frequency, is driven through the first frequency doubler unit in response to the first and second input signal,
wherein a second current, the frequency spectrum of which also comprises the second harmonic frequency, is driven through the second frequency doubler unit in response to the third and fourth input signals,
wherein a balanced output signal of the frequency doubler is influenced by the first and second current, and
wherein a coil having two outer terminals and a middle terminal, forms a first load in the first frequency doubler unit and a second load in the second frequency doubler unit, and
wherein the voltage between the coil's outer terminals forms the output signal of the frequency doubler.

12. Balanced frequency doubler of claim 11,
wherein the first and second frequency doubler units are electrically arranged in parallel and have two common connection points, and
wherein the coil's middle terminal is one of the two common connection points.

13. Balanced frequency doubler of comprising:
a first frequency doubler unit providing a first input port and a second input port,
a second frequency doubler unit providing a third input port and a fourth input port,
wherein the first, second, third and fourth input ports are configured to receive a first, second, third and fourth input signal, respectively,
wherein the first, second, third and fourth input signals all have the same first harmonic frequency, but are phase-shifted relative to one another,
wherein a first current, the frequency spectrum of which comprises a second harmonic frequency that is double the first harmonic frequency, is driven through the first frequency doubler unit in response to the first and second input signal,
wherein a second current, the frequency spectrum of which also comprises the second harmonic frequency, is driven through the second frequency doubler unit in response to the third and fourth input signals,
wherein a balanced output signal of the frequency doubler is influenced by the first and second current, and
wherein the input signals all have an offset voltage.

14. Balanced frequency doubler of claim 13, wherein the input signals are sinusoidal signals and the sinusoidal portion of all four input signals has the same amplitude and all input signals have the same offset voltage.

15. Balanced frequency doubler comprising:
a first frequency doubler unit providing a first input port and a second input port,
a second frequency doubler unit providing a third input port and a fourth input port,
wherein the first, second, third and fourth input ports are configured to receive a first, second, third and fourth input signal, respectively,
wherein the first, second, third and fourth input signals all have the same first harmonic frequency, but are phase-shifted relative to one another,
wherein a first current, the frequency spectrum of which comprises a second harmonic frequency that is double the first harmonic frequency, is driven through the first frequency doubler unit in response to the first and second input signal,
wherein a second current, the frequency spectrum of which also comprises the second harmonic frequency, is driven through the second frequency doubler unit in response to the third and fourth input signals,
wherein a balanced output signal of the frequency doubler is influenced by the first and second current; and
wherein the balanced frequency doubler comprises a quadrature voltage-controlled oscillator that generates the first, second, third and fourth input signal.

16. Balanced frequency doubler comprising:
a first frequency doubler unit providing a first input port and a second input port,
a second frequency doubler unit providing a third input port and a fourth input port,
wherein the first, second, third and fourth input ports are configured to receive a first, second, third and fourth input signal, respectively,
wherein the first, second, third and fourth input signals all have the same first harmonic frequency, but are phase-shifted relative to one another,
wherein a first current, the frequency spectrum of which comprises a second harmonic frequency that is double the first harmonic frequency, is driven through the first frequency doubler unit in response to the first and second input signal,
wherein a second current, the frequency spectrum of which also comprises the second harmonic frequency, is driven through the second frequency doubler unit in response to the third and fourth input signals,
wherein a balanced output signal of the frequency doubler is influenced by the first and second current; and
wherein the first frequency doubler unit is a push-push frequency doubler unit,
wherein the second frequency doubler unit is a push-push frequency doubler unit,
wherein the first and second input signals are in-phase signals and the third and fourth input signals are quadrature signals,
wherein the phase difference between the first and second input signal is 180° or at least in a range between 162° and 198°,
wherein the phase difference between the third and fourth input signal is 180° or at least in a range between 162° and 198°,
wherein the phase difference between the first and third input signal is 90° or at least in a range between 81° and 99°.

17. Balanced frequency doubler comprising:
a first frequency doubler unit providing a first input port and a second input port,
a second frequency doubler unit providing a third input port and a fourth input port, wherein the first, second, third and fourth input ports are configured to receive a first, second, third and fourth input signal, respectively, wherein the first, second, third and fourth input signals all have the same first harmonic frequency, but are phase-shifted relative to one another, wherein a first current, the frequency spectrum of which comprises a second harmonic frequency that is double the first harmonic frequency, is driven through the first frequency doubler unit in response to the first and second input signal, wherein a second current, the frequency spectrum of which also comprises the second harmonic frequency, is driven through the second frequency doubler unit in response to the third and fourth input signals, wherein a balanced output signal of the frequency doubler is influenced by the first and second current, and wherein the first and second doubler unit are electrically arranged in parallel and have two common connection points, wherein each of the first and second doubler units has an electrical midpoint, the electrical potential of which lies between the electrical potentials of the two common connection points, and wherein the output signal of the frequency doubler is the voltage between the electrical midpoints.

* * * * *